United States Patent
Rodov et al.

(10) Patent No.: US 9,391,184 B2
(45) Date of Patent: Jul. 12, 2016

(54) INSULATED GATE TURN-OFF DEVICE WITH TURN-OFF TRANSISTOR

(71) Applicant: Pakal Technologies, LLC, San Francisco, CA (US)

(72) Inventors: Vladimir Rodov, Seattle, WA (US); Hidenori Akiyama, Miyagi (JP); Richard A. Blanchard, Los Altos, CA (US); Woytek Tworzydlo, Austin, TX (US)

(73) Assignee: Pakal Technologies, LLC, San Francisco, CA (US)

( * ) Notice: Subject to any disclaimer, the term of this patent is extended or adjusted under 35 U.S.C. 154(b) by 0 days.

(21) Appl. No.: 14/701,168

(22) Filed: Apr. 30, 2015

(65) Prior Publication Data
US 2015/0349104 A1    Dec. 3, 2015

Related U.S. Application Data

(60) Provisional application No. 62/003,399, filed on May 27, 2014.

(51) Int. Cl.
  *H01L 29/745* (2006.01)
  *H01L 29/423* (2006.01)
  *H01L 29/06* (2006.01)

(52) U.S. Cl.
  CPC ........ *H01L 29/7455* (2013.01); *H01L 29/0696* (2013.01); *H01L 29/4236* (2013.01)

(58) Field of Classification Search
  None
  See application file for complete search history.

(56) References Cited

U.S. PATENT DOCUMENTS

| | | | | |
|---|---|---|---|---|
| 6,265,735 | B1* | 7/2001 | Takahashi | H01L 29/0692 257/135 |
| 8,878,237 | B2 | 11/2014 | Akiyama et al. | |
| 2003/0089966 | A1* | 5/2003 | Hattori | H01L 29/1095 257/565 |
| 2014/0034995 | A1 | 2/2014 | Akiyama et al. | |

* cited by examiner

*Primary Examiner* — Angel Roman
(74) *Attorney, Agent, or Firm* — Patent Law Group LLP; Brian D. Ogonowsky

(57) ABSTRACT

An insulated gate turn-off (IGTO) device, formed as a die, has a layered structure including a p+ layer (e.g., a substrate), an n− epi layer, a p-well, vertical insulated gate regions formed in the p-well, and n+ regions between the gate regions, so that vertical NPN and PNP transistors are formed. The device is formed of a matrix of cells. To turn the device on, a positive voltage is applied to the gate, referenced to the cathode. The cells further contain a vertical p-channel MOSFET, for shorting the base of the NPN transistor to its emitter, to turn the NPN transistor off when the p-channel MOSFET is turned on by a slight negative voltage applied to the gate. This allows the IGTO device to be more easily turned off while in a latch-up condition, when the device is acting like a thyristor.

16 Claims, 5 Drawing Sheets

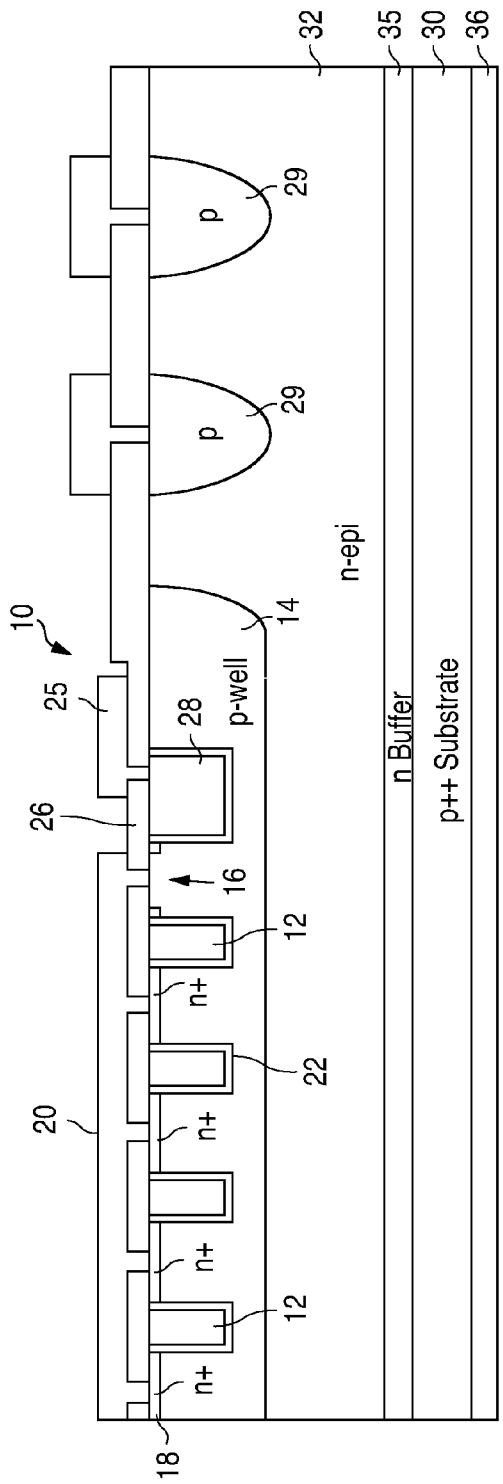
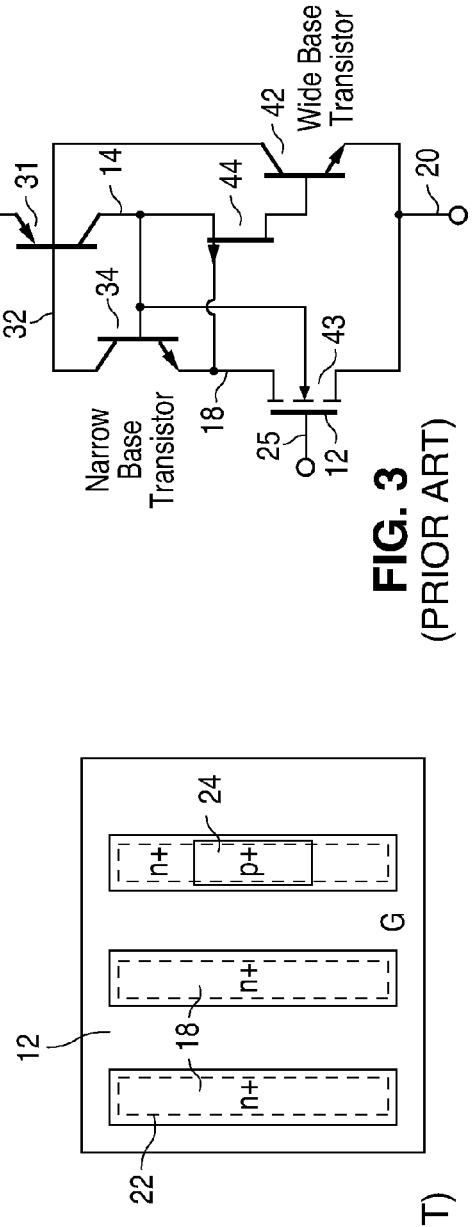
FIG. 1 (PRIOR ART)
FIG. 2 (PRIOR ART)
FIG. 3 (PRIOR ART)

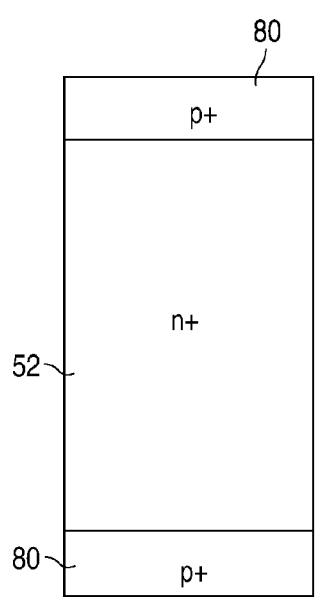 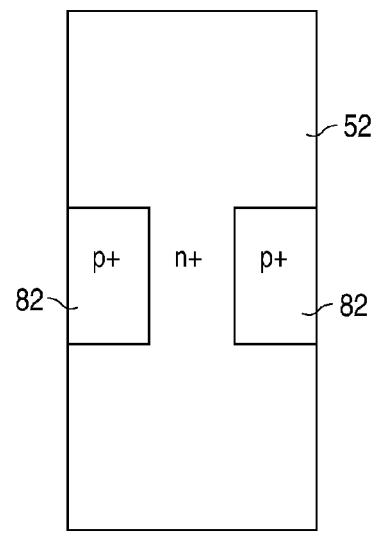 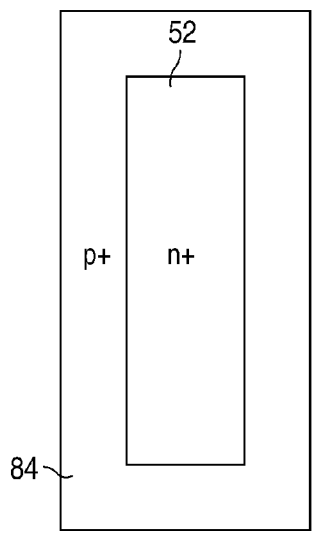
FIG. 13  FIG. 14  FIG. 15

INSULATED GATE TURN-OFF DEVICE WITH TURN-OFF TRANSISTOR

CROSS-REFERENCE TO RELATED APPLICATIONS

This application is based on provisional application Ser. No. 62/003,399, filed May 27, 2014, by Vladimir Rodov et al., assigned to the present assignee and incorporated herein by reference.

FIELD OF THE INVENTION

This invention relates to insulated gate turn-off (IGTO) devices and, more particularly, to an IGTO device design that includes an improved turn-off feature.

BACKGROUND

Prior art FIG. 1 is a cross-section of a small portion of an IGTO device 10 (similar in some respects to a thyristor) reproduced from the assignee's U.S. Pat. No. 8,878,237, incorporated herein by reference. The portion is near an edge of the device and shows a plurality of cells having vertical gates 12 formed in insulated trenches. A 2-dimensional array of the cells may be formed in a common p-well 14, and the cells are connected in parallel. The edge of the device suffers from field crowding, and the edge cell is modified to increase ruggedness of the device. The edge cell has an opening 16 in the n+ source region 18 where the cathode electrode 20 shorts the n+ source region 18 to the p-well 14. Such shorting increases the tolerance to transients to prevent unwanted turn on and prevents the formation of hot spots. The configuration of the edge cell may also be used in other cells of the device for a more uniform current flow across the device.

FIG. 2 is a top down view of only three of the cells, showing only the top semiconductor surface. FIG. 3 is an equivalent circuit.

The vertical gates 12 are insulated from the p-well 14 by an oxide layer 22. A p+ contact 24 region (FIG. 2) may be used at the opening 16 of the edge cell for improved electric contact to the p-well 14. The narrow gates 12 (doped polysilicon) are connected together outside the plane of the drawing and are coupled to a gate voltage via the gate electrode 25 contacting the polysilicon portion 28. A patterned dielectric layer 26 insulates the metal from the various regions. The guard rings 29 at the edge of the cell reduce field crowding for increasing the breakdown voltage.

An NPNP semiconductor layered structure is formed. There is a bipolar PNP transistor 31 (FIG. 3) formed by a p+ substrate 30, an n– epitaxial (epi) layer 32, and the p– well 14. There is also a bipolar NPN transistor 34 (FIG. 3) formed by the n-epi layer 32, the p-well 14, and the n+ source region 18. An n-type buffer layer 35, with a dopant concentration higher than that of the n– epi layer 32, reduces the injection of holes into the n– epi layer 32 from the p+ substrate 30 when the device is conducting. A bottom anode electrode 36 contacts the substrate 30, and a cathode electrode 20 contacts the n+ source region 18. The p-well 14 surrounds the gate structure, and the n– epi layer 32 extends to the surface around the p-well 14.

When the anode electrode 36 is forward biased with respect to the cathode electrode 20, but without a sufficiently positive gate bias, there is no current flow, since the product of the betas (gains) of the PNP and NPN transistors is less than one (i.e., there is no regeneration activity).

When the gate is forward biased, electrons from the n+ source region 18 become the majority carriers along the gate sidewalls and below the bottom of the trenches in an inversion layer, causing the effective width of the NPN base (the portion of the p-well 14 between the n-layers) to be reduced. As a result, the beta of the NPN transistor increases to cause the product of the betas to exceed one. This results in "break-over," when holes are injected into the lightly doped n– epi layer 32 and electrons are injected into the p-well 14 to fully turn on the device. Accordingly, the gate bias initiates the turn-on, and the full turn-on (due to regenerative action) occurs when there is current flow through the NPN transistor as well as current flow through the PNP transistor.

When the gate bias is removed, such as the gate electrode 25 being shorted to the cathode electrode 20, the IGTO device turns off.

With reference to the equivalent circuit of FIG. 3, when the device is biased on with a sufficiently positive gate voltage, an inversion layer (electrons) is created in the p-well along the gate, creating the narrow-base transistor 34 (the effective width of the p-well base is reduced) having a relatively high gain to turn the device on. When the gate voltage is below the threshold (e.g., at 0 volts), the NPN base width is relatively large, resulting in low beta, and the device is off. This off-state is represented by the wide-base transistor 42. The conductivity of the MOSFET 43, formed by the n+ source region 18, the p-well 14, the n-epi layer 32, and the gate 12, determines whether the narrow-base or wide-base NPN transistor occurs. The JFET 44 represents the enablement or disablement of the wide-base MOSFET 42 in response to the gate voltage and can be deleted for a simplified equivalent diagram. The JFET 44 is considered on when the MOSFET 43 is off and considered off when the MOSFET 43 is on.

One issue with the device of FIG. 1 is that a high current (which may be constant or a transient) may cause latch-up, and a relatively large negative gate voltage is needed to turn the device off. Such a large negative voltage may not be convenient to generate. During latch-up, the on-resistance is desirably lower, and the device acts as a thyristor.

Accordingly, what is needed is an improvement to an IGTO device where the device can be turned off more easily with a less negative gate voltage when a latch-up occurs.

SUMMARY

An IGTO device having vertical gates has a plurality of cells connected in parallel. Various epitaxial layers form NPNP layers that create vertical bipolar NPN and PNP transistors. Each cell generally includes a top n+ source region, a p-well between and below opposing vertical gates, an n– epi layer below the p-well, and a p+ substrate to form the NPNP layers. A positive voltage is applied to the p+ substrate (the anode), and a more negative voltage is applied to the n+ source region (the cathode). A sufficiently positive gate voltage reduces the base width of the NPN transistor to increase its gain, turning on the device to cause a current to flow between the anode and cathode. Removing the gate voltage (or shorting the gate to the cathode) turns the device off if there is no latch-up condition.

In the event there is latch-up caused by regenerative action, simply removing the gate voltage is not enough to turn off the device. The prior art previously described required the gate voltage to be a relatively high negative voltage (relative to the cathode voltage). In the present invention, to allow the device to be turned off after latch-up with a much less negative gate voltage, the cells are formed to have upper p+ regions on both sides of the n+ source region and extending vertically below the n+ source region, and an n layer is formed between the p-well and the upper p+ regions. The n+ source regions and the upper p+ regions are shorted by the cathode electrode. The p+ regions, the n layer, and the p-well form a vertical p-channel MOSFET, where the n-layer adjacent the vertical gate forms the body. The p-channel MOSFET turns on with a slightly negative gate voltage (a threshold voltage) relative to the cathode electrode (the p+ region acts as a source for the p-channel MOSFET). Turning on the p-channel MOSFET shorts (to an extent) the base-emitter of the wide-base vertical NPN transistor to turn it off and to thereby turn off the IGTO device, even when there is latch-up. In the event there is no latch-up, the p-channel MOSFET is not required to help turn off the device, so simply shorting the gate to the cathode electrode will shut off the device.

Since cells near the edge of the device experience field crowding, those edge cells do not have the above-described configuration but may have an opening in the n+ source region where the cathode electrode shorts the n+ source regions to the p-well. This configuration improves the ruggedness of the device and prevents unwanted turn-on due to transients.

By modifying the dopant levels and layer thicknesses, the forward voltage drop of the IGTO device can be varied, and the device can be made more or less susceptible to latch-up.

Other embodiments are described.

BRIEF DESCRIPTION OF THE DRAWINGS

FIG. 1 is a cross-sectional view of an edge portion of the assignee's prior art IGTO device having an edge cell with the p-well shorted to the n+ source layer to improve ruggedness.

FIG. 2 is a top down view of three cells in the device of FIG. 1 at the surface of the semiconductor regions.

FIG. 3 is a simplified equivalent circuit of the device of FIG. 1 for the on and off states.

FIG. 13 is a top down view of an alternative embodiment, where the upper p+ regions are only located near both ends of the gates. Thus, the action of the added p-channel MOSFET takes place only near the ends of the gates, and the increased n+ source area reduces on-resistance.

FIG. 14 is a top down view of an alternative embodiment, where the upper p+ regions are only located near the middle of the gates. Thus, the action of the added p-channel MOSFET only takes place near the middle of the gates, and the increased n+ source area reduces on-resistance.

FIG. 15 is a top down view of an alternative embodiment, where the upper p+ regions completely surround the n+ source areas, such that the action of the added p-channel MOSFET occurs adjacent to the entire gate.

Elements that are the same or equivalent are labelled with the same numerals.

DETAILED DESCRIPTION

Figure 4:
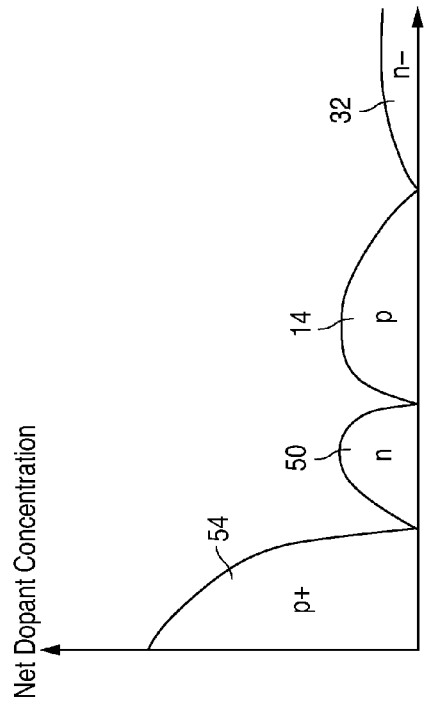
FIG. 4 is a cross-sectional view of a single cell, in accordance with one embodiment of the invention, that may replace the cells in the device of FIG. 1, where the improved cells enable the device to be turned off after latch-up with only a small negative gate voltage (relative to the cathode electrode).
Figure 5:
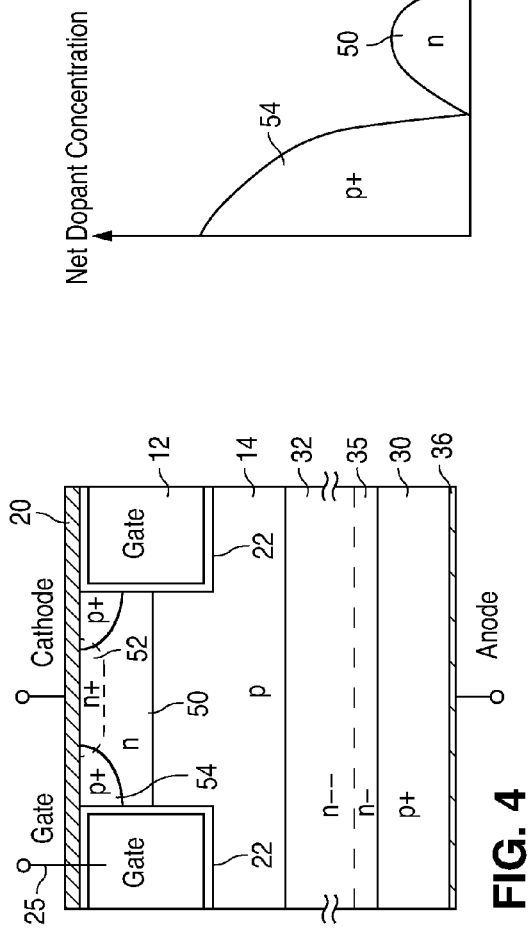
FIG. 5 is a dopant profile of the cell of FIG. 4 in the silicon along the trench gate, where the x axis is the depth into the device starting from the upper p+ region.
Figure 6:
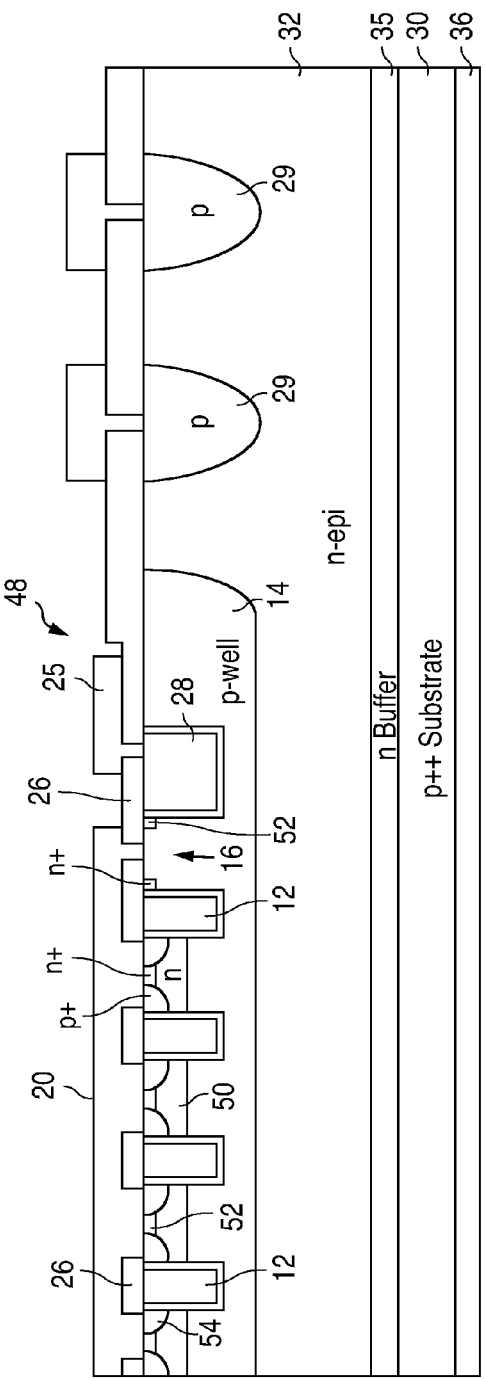
FIG. 6 is a cross-sectional view of an edge portion of an IGTO device, in accordance with one embodiment of the invention, where the cell of FIG. 4 is used throughout the device except for edge cells.

FIG. 4 is a cross-sectional view of a single cell of an IGTO device, formed as a single die, in accordance with one embodiment of the invention. FIG. 5 is a dopant profile from the top through to the n-epi layer 32 along the gate sidewall. FIG. 6 illustrates the cell of FIG. 4 replacing the cells of FIG. 1 to form the improved IGTO device 48. The common features of FIGS. 1 and 6 are labelled the same.

In contrast to the IGTO device of FIG. 1, the cell of FIG. 4 includes an n-layer 50 that is more lightly doped than an n+ source region 52. A p+ region 54 is formed on both sides of the n+ source region 52, adjacent the gate 12, and extends below the n+ source region 52. The p-layer 50 extends below the p+ region 54 to form a channel in a p-channel MOSFET 58, shown in the equivalent circuit of FIG. 7. The n-layer 50 can also be referred to as a body region of a DMOS transistor. The p+ regions 54 and the n+ source region 18 are shorted together by the cathode electrode 20.

FIG. 5 shows the relative net doping levels of the p+ region 54, n-layer 50, p-well 14, and n– epi layer 32.

In FIG. 6, the novel cell is shown replacing the prior art cells in FIG. 1, except for the edge cell with the opening 16 in the n+ source 52. In an actual embodiment, two or three cells in from the edge may be identical to the edge cell in FIG. 6.

Figure 7:
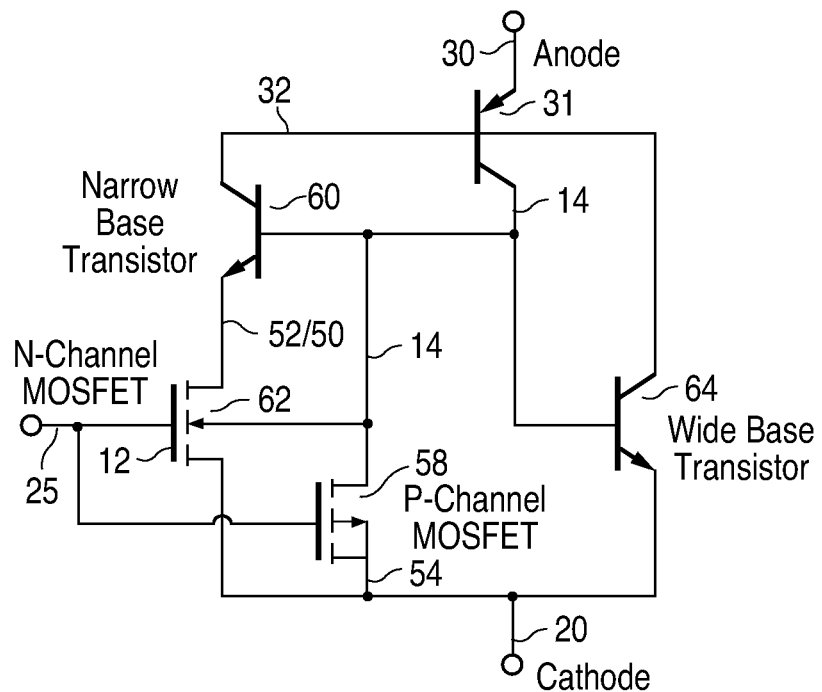
FIG. 7 is an equivalent circuit of the cell of FIG. 4 showing the added p-channel MOSFET.

The operation of the cell will be explained with reference to the equivalent circuit of FIG. 7.

A bipolar PNP transistor 31 is formed by the p++ substrate 30, the n-epi layer 32, and the p-well 14. When the IGTO device is turned on by a positive gate voltage, a narrow-base NPN transistor 60 is formed by the n+ source region 52 (in combination with the n-layer 50), the p-well 14, and the n-epi layer 32. The narrow-base transistor 60 exists when the gate voltage is above the threshold to turn on the n-channel MOSFET 62. The n-channel MOSFET 62, when turned on, inverts the p-well 14 in the vicinity of the gate 12 to reduce the effective width of the p-type base of the NPN transistor 60, which increases the beta of the NPN transistor 60 so the product of the betas of the PNP transistor 31 and the NPN transistor 60 is greater than one. This causes significant current to flow through the device, which turns the device on even more.

When the gate voltage is below the threshold, such as the gate being shorted to the cathode electrode 20, the wide p-type base between the n-type layers 50 and 32 creates the wide-base NPN transistor 64 having a low beta. The product of the NPN and PNP transistor betas is less than one, so the device remains off.

The present invention adds the p-channel MOSFET 58 across the base-emitter of the NPN transistor 64.

When the gate voltage applied to the gate electrode 25 is above the threshold for turn-on of the IGTO device, the p-channel MOSFET 58 is off and has no effect on the operation. When the current through the IGTO device is sufficiently high, latch-up occurs, initiating thyristor action, and the device cannot be turned off simply by shorting the gate to the cathode electrode 20. By applying a gate voltage sufficiently lower than the cathode voltage (to exceed the threshold voltage of the p-channel MOSFET 58), the n-layer 50 adjacent to the gate 12 inverts to create a p-channel between the p+ region 54 and the p-well 14. This conducting p-channel MOSFET 58 turns off the base-emitter diode of the NPN transistor 64, forcing the NPN transistor to turn off. Therefore, there is no regenerative action. Shorting is not required, since the base-emitter voltage just has to be low enough to turn off the NPN transistor 64. The doping level of the n-layer 32 determines the threshold voltage of the p-channel MOSFET 58.

Accordingly, the IGTO device 48 (FIG. 6) may be turned off after being in latch-up with only a small negative gate threshold voltage for the p-channel MOSFET 58, instead of a large negative gate voltage for the prior art FIG. 1 device. For example, the device of FIG. 1 may need a gate voltage of −12 volts to turn the device off after latch-up, while the device of FIG. 6 may need a gate voltage of only −3 volts, depending on the particular characteristics of the device 48. As previously mentioned, latch-up can be beneficial since it lowers the voltage drop across the device 48.

Figure 8:
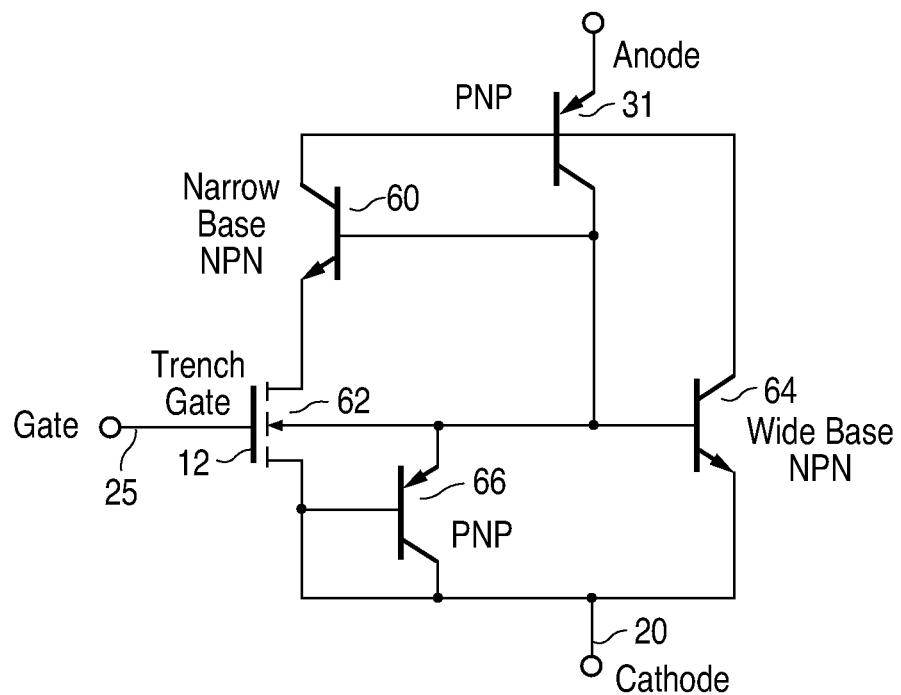
FIG. 8 is an alternative equivalent circuit of the cell of FIG. 4 showing the added PNP transistor, which is an inherent part of the p-channel MOSFET of FIG. 7.

FIG. 8 illustrates how the three semiconductor regions in the p-channel MOSFET 58 actually form a PNP transistor 66. By proper doping, the PNP transistor 66 can prevent unwanted latch-up in the on or off states, since it can turn on sufficiently to prevent the wide-base NPN transistor 64 from turning on with a transient current. If a positive gate voltage is applied, the narrow-base NPN transistor 60 turns on (to increase the beta) to cause the IGTO device to conduct current. The required dopant levels may be determined by simulation.

By using opposite doping polarities for all the semiconductor layers/regions, the IGTO device 48 would be turned on by a negative gate threshold voltage. The operation would be similar as described above but with opposite polarity transistors in the equivalent circuit.

One possible method for fabricating the device 48 of FIG. 6 is described below.

The starting p+ substrate 36 may have a dopant concentration of $1 \times 10^{18}$ to $2 \times 10^{19}$ cm$^3$.

The n-type buffer layer 35 is then grown to a thickness of 3-10 microns thick and has a dopant concentration between about $10^{17}$ to $5 \times 10^{17}$ cm$^{-3}$.

The n− epi layer 32 is grown to a thickness of 40-70 microns (for a 600V device) and has a doping concentration between about $5 \times 10^{13}$ to $5 \times 10^{14}$ cm$^{-3}$. This dopant concentration can be obtained by in-situ doping during epi growth.

A field oxide is then grown to a thickness of, for example, 0.6-2 microns. LOCOS technology may be used. The active areas are defined using a mask if LOCOS technology is not used. Otherwise, the active areas are defined by the LOCOS oxide mask.

The p-well 14 is then formed by masking and boron dopant implantation. Preferably, some of the doping of the p guard rings 29 is performed in the same patterned implant. The peak doping in the p-well 14 can be, for example, $10^{16}$-$10^{18}$ cm$^{-3}$. The depth of the p-well 14 depends on the maximum voltage of the device and may be between 0.5-10 microns.

The n-layer 50 is then formed in the p-well 14 and doped to have a concentration greater than that of the n-epi layer 32. The depth of the n-layer is between the gate trench depth and the depth of the p+ region 54.

The n+ source region 52 is formed by an implant of arsenic or phosphorus at an energy of 10-150 keV and an area dose of $5 \times 10^{13}$ to $10^{16}$ cm$^{-2}$, to create a dopant concentration exceeding $10^{19}$ cm$^{-3}$. In one embodiment, the n+ source region 52 has a depth of 0.05-1.0 microns.

The p+ region 54 is then formed to a depth below that of the n+ source region 52 to have a dopant concentration exceeding $10^{19}$ cm$^{-3}$.

The gate trenches are then etched in the active areas. In one embodiment, the trenches can be, for example, 1-10 microns deep, but the minimum lateral trench widths are constrained by lithographic and etching limitations.

After the trenches are etched, gate oxide 22 is grown on the sidewalls and bottoms of the trenches to, for example, 0.05-0.15 microns thick. Conductive material, such as heavily doped polysilicon, then fills the trenches and is planarized to form the gate regions in all the cells.

An oxide layer 26 is deposited, and a contact mask opens the oxide layer 26 above the selected regions on the top surface to be contacted by metal electrodes.

Various metal layers are then deposited to form the gate electrode 25, the cathode electrode 20, and the anode electrode 36. The p+ substrate 30 may be thinned.

The p+ substrate 30 may be any p+ layer that is formed, and the original substrate may be removed. Accordingly, the substrate 30 may be also referred to as a "layer," whether it is a substrate or a formed layer on which the anode electrode 36 is deposited. Similarly, the implanted or diffused p-well 14 may be a p-type epitaxial layer doped during growth, where the term "layer" describes both the well and the epitaxial layer.

It is also possible to use an n-type lightly doped starting wafer and form a p+ layer (substituting for the p+ substrate 30) and the n-type buffer layer 35 by implantation and diffusion.

Figure 10:
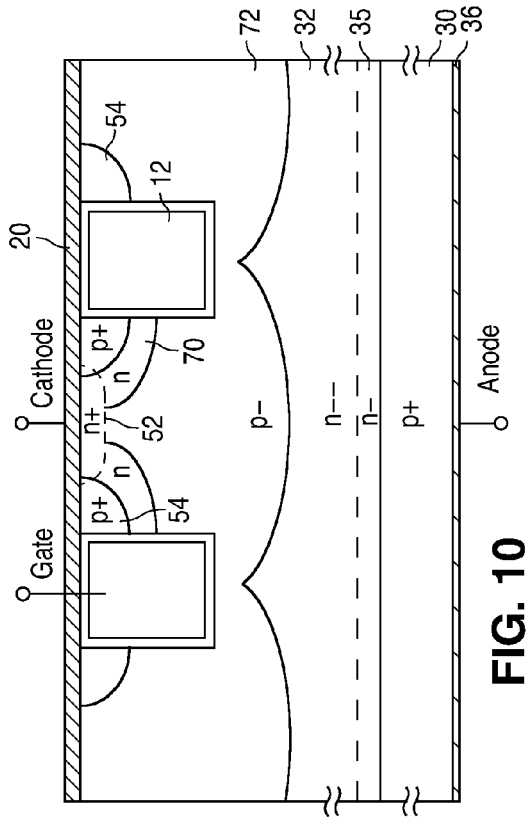
FIG. 10 illustrates another alternative to the cell of FIG. 4.
Figure 9:
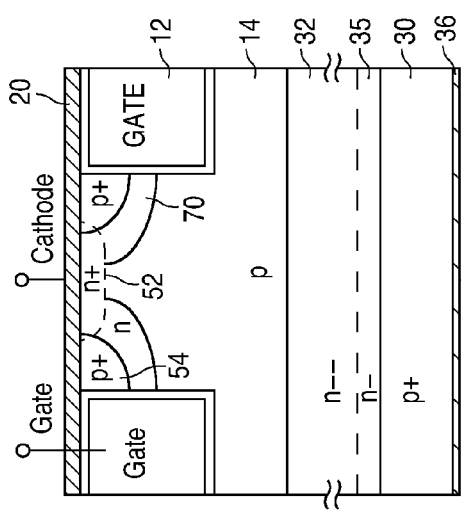
FIG. 9 illustrates an alternative to the cell of FIG. 4.
Figure 11:
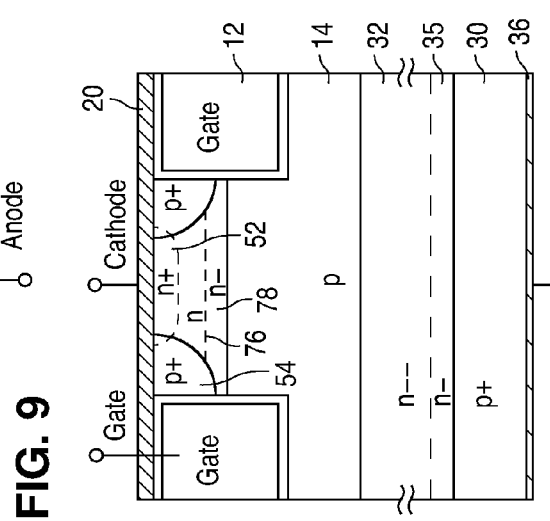
FIG. 11 illustrates another alternative to the cell of FIG. 4.

FIGS. 9-11 illustrate variations of the cell of FIG. 4.

In FIG. 9, there is no n-layer 70 directly below the n+ source region 52 near the middle between the gates 12. The n-layer 70 may be doped from the surface and forms the channel region of the p-channel MOSFET adjacent to the gate 12.

FIG. 10 illustrates a cell, similar to that of FIG. 9, but where the p-well 72 is formed using a modified process where the thickness of the p-well 72 below the gates 12 is reduced compared to the thickness of the p-well 72 between the gates 12. This allows the gates 12 to create a narrower base for the NPN transistor (increases beta) when the gates are positively biased. Further, by controlling the depth and doping profile of the p-well 72, the areas where high current flows after breakover occurs (device is on) can be limited to the deepest regions of the p-well 72, thereby keeping the current flow path away from the walls of the gate trenches, improving ruggedness (breakdown voltage).

FIG. 11 illustrates how the n-layer may be formed by two different dopant levels to form a first n-layer 76 and a more lightly doped n-layer 78. The p+ region 54 extends into the n-layer 78 so that the n-layer 78 forms a channel region of the p-channel MOSFET. The negative gate voltage needed to turn on the p-channel MOSFET depletes the n-layer 78 more than the n-layer 76 so that the required gate voltage to turn on the p-channel MOSFET can be less negative. The combination of the n-layers 76 and 78 allows the IGTO device to conduct a greater current density under gate control.

In some embodiments, some of the trenches and gates may extend into the n-epi layer 32.

Figure 12:
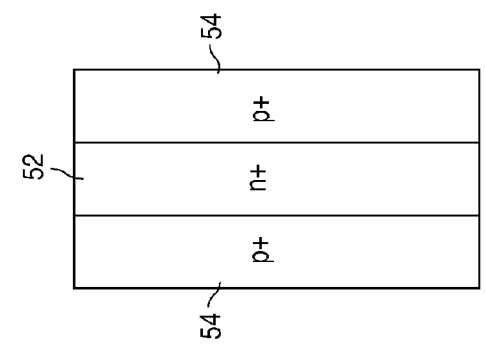
FIG. 12 is a top down view of any of the improved cells between the gate trenches, where the view is along the length of the gate normal to the plane of the drawing sheet.

FIGS. 12-14 illustrate different patterns for the p+ regions adjacent the gate, while still achieving the benefits of the p-channel MOSFET. FIGS. 12-14 are top down views of only the p+ regions and the n+ source regions between the gates.

In FIG. 12, the p+ regions 54 are shown extending the entire width of the gates on both sides of the central n+ source region 52.

FIG. 13 illustrates how the p+ regions 80 are only near the ends of the opposing gates yet still provide the sufficient shorting of the base-emitter of the NPN transistor to turn off the IGTO device in the event of latch-up. In such a configuration, two smaller p-channel MOSFETs are created in each cell.

FIG. 14 illustrates that the p+ regions 82 can be formed only in the middle portion of the gates to form a smaller p-channel MOSFET.

FIG. 15 illustrates that the p+ regions 84 can be formed to completely surround the n+ source regions 52, such that the action of the added p-channel MOSFET occurs adjacent to the entire gate.

In another embodiment, there is only one p-channel MOSFET formed between any two opposing gates. In another embodiment, not all the cells are identical and only some of the cells include the p-channel MOSFET.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. An insulated gate turn-off (IGTO) device formed as a die comprising:
   a first semiconductor layer of a first conductivity type;
   a second semiconductor layer of a second conductivity type overlying the first semiconductor layer;
   a third semiconductor layer of the first conductivity type overlying at least a portion of the second semiconductor layer;
   an array of cells comprising a plurality of insulated gate regions within trenches formed at least within the third semiconductor layer;
   at least some of the cells comprising:
      a first semiconductor region of the second conductivity type overlying the third semiconductor layer and adjacent to an insulated gate region;
      a second semiconductor region of the first conductivity type overlying the first semiconductor region and adjacent to the insulated gate region;
      a third semiconductor region of the second conductivity type adjacent the first semiconductor region and the second semiconductor region and being more highly doped than the first semiconductor region; and
      a first conductor shorting the second semiconductor region to the third semiconductor region,
   wherein the first semiconductor region, the second semiconductor region, and the third semiconductor layer form a MOSFET, where a voltage applied to the insulated gate region greater than a threshold voltage of the MOSFET inverts the first semiconductor region adjacent to the insulated gate region to form a lower resistance path between the second semiconductor region and the third semiconductor layer to reduce a beta of a bipolar transistor formed by the third semiconductor region, the third semiconductor layer and the second semiconductor layer to turn off the IGTO device.

2. The device of claim 1 wherein the first conductivity type is a p-type, and the second conductivity type is an n-type.

3. The device of claim 1 wherein the first conductivity type is an n-type, and the second conductivity type is a p-type.

4. The device of claim 1 wherein in the second semiconductor region is more highly doped than the third semiconductor layer.

5. The device of claim 1 wherein the first semiconductor layer is a growth substrate.

6. The device of claim 1 wherein the first semiconductor region comprises a first portion underlying a second portion, wherein the second portion is more highly doped than the first portion, wherein the second semiconductor region extends into the first portion so that the first portion is a channel region in the MOSFET.

7. The device of claim 1 wherein the third semiconductor layer is formed as a well.

8. The device of claim 1 wherein the first semiconductor region is formed as an epitaxial layer.

9. The device of claim 1 wherein the first semiconductor region is formed as a doped region.

10. The device of claim 1 wherein the third semiconductor layer has a variety of thicknesses, wherein a thickness of the third semiconductor layer below the insulated gate regions is less than a thickness of the third semiconductor layer between the insulated gate regions.

11. The device of claim 1 further comprising a first electrode electrically contacting the first semiconductor layer, and a second electrode electrically contacting the second semiconductor region and the third semiconductor region, wherein the second electrode is the first conductor.

12. The device of claim 11 wherein the first electrode is an anode electrode and the second electrode is a cathode electrode.

13. The device of claim 1 wherein the second semiconductor region runs along a width of the insulated gate regions.

14. The device of claim 1 wherein the second semiconductor region is only located near an end of the insulated gate regions.

15. The device of claim 14 wherein the second semiconductor region is only located near each end of the insulated gate regions.

16. The device of claim 1 wherein the second semiconductor region is only located along a middle region of the insulated gate regions.

* * * * *